United States Patent
Yoshikawa et al.

(10) Patent No.: US 7,333,582 B2
(45) Date of Patent: Feb. 19, 2008

(54) TWO-POINT FREQUENCY MODULATION APPARATUS, WIRELESS TRANSMITTING APPARATUS, AND WIRELESS RECEIVING APPARATUS

(75) Inventors: Hiroyuki Yoshikawa, Machida (JP); Shunsuke Hirano, Yokohama (JP); Tatsuto Oka, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 551 days.

(21) Appl. No.: 11/066,561

(22) Filed: Feb. 28, 2005

(65) Prior Publication Data

US 2005/0232385 A1   Oct. 20, 2005

(30) Foreign Application Priority Data

Mar. 2, 2004  (JP)  .............................. 2004-057523

(51) Int. Cl.
- *H03D 3/24* (2006.01)
- *H04L 27/00* (2006.01)

(52) U.S. Cl. ...................................... 375/376; 375/295
(58) Field of Classification Search ................ 375/295, 375/371, 373, 375, 376; 327/141, 144, 146, 327/147, 149, 155, 156, 158, 161
See application file for complete search history.

(56) References Cited

U.S. PATENT DOCUMENTS

| 6,211,747 | B1 | 4/2001 | Trichet et al. |
| 6,515,553 | B1 * | 2/2003 | Filiol et al. ................. 332/127 |
| 6,933,798 | B2 * | 8/2005 | Hammes et al. ............ 332/127 |
| 7,154,347 | B2 * | 12/2006 | Grewing et al. .............. 331/23 |
| 2003/0043950 | A1 * | 3/2003 | Hansen et al. .............. 375/376 |

\* cited by examiner

*Primary Examiner*—Tesfaldet Bocure
(74) *Attorney, Agent, or Firm*—Stevens, Davis, Miller & Mosher, LLP

(57) ABSTRACT

A two-point frequency modulation apparatus is provided that reduces input timing difference and improves modulation accuracy. Two-point frequency modulation apparatus 10 has: PLL circuit 11; frequency division ratio generator 13 that generates the frequency division ratio in frequency divider 111 based on first digital baseband signal S1 and carrier signal; adder 114 that adds second digital baseband signal S2 to the output signal of loop filter 113; a delay index calculator (filter coefficient calculator 17) that calculates the delay index based on the magnitude of change in the amplitude of the output signal of adder 114; and a delay adjuster (digital filter 18) that shifts the phase of one of first digital baseband signal S1 and second digital baseband signal S2 according to the delay index so as to reduce the phase difference.

10 Claims, 17 Drawing Sheets

FIG.3

| DELAY | | 0 | 1 | 2 | 3 | 4 | 5 | 6 | 7 | 8 |
|---|---|---|---|---|---|---|---|---|---|---|
| | COEFFI-CIENT T/S RATIO | 0/8 | 1/8 | 2/8 | 3/8 | 4/8 | 5/8 | 6/8 | 7/8 | 8 |
| TAP COEFFICIENT | a0 | 8/8 | 7/8 | 6/8 | 5/8 | 4/8 | 3/8 | 2/8 | 1/8 | 0/8 |
| | a1 | 0/8 | 1/8 | 2/8 | 3/8 | 4/8 | 5/8 | 6/8 | 7/8 | 8/8 |

17M

185: TIMING ADJUSTMENT MODE SWITCH 186,187: MULTIPLIER

US 7,333,582 B2

TWO-POINT FREQUENCY MODULATION APPARATUS, WIRELESS TRANSMITTING APPARATUS, AND WIRELESS RECEIVING APPARATUS

BACKGROUND OF THE INVENTION

1. Field of the Invention

The present invention relates to a two-point frequency modulation apparatus, wireless transmitting apparatus, and wireless communication apparatus for use with communication equipments, such as mobile communication terminals including mobile telephones and base stations that communicate with the mobile communication terminals.

2. Description of the Related Art

Generally speaking, the PLL (Phase Locked Loop) modulation scheme for use with communication equipments is expected to realize low costs, low power consumption, excellent noise characteristics, and high modulation accuracy. To improve the modulation accuracy of this PLL modulation scheme, preferably, the PLL bandwidth (i.e. PLL bandwidth) is wider than the bandwidth of the modulation signal (i.e. modulation bandwidth).

However, widening the PLL bandwidth has the risk of deteriorating noise characteristics. So, the kind of two-point frequency modulation scheme is presently proposed whereby the PLL bandwidth is set narrower than the modulation bandwidth and the modulation in the PLL bandwidth and the modulation outside the PLL bandwidth are performed at two different points (see U.S. Pat. No. 6,211,747).

As shown in FIG. 1, a wideband modulation PLL system employing the above-noted two-point modulation scheme has: a PLL arrangement including voltage controlled oscillator (VCO) 1A, frequency divider 1B, phase comparator 1C, loop filter 1D, and adder 1E; modulation sensitivity table 4; delta-sigma modulator 5; D/A convertor 6; A/D convertor 7; adder 2; and controller 3.

VCO 1A in the PLL arrangement outputs an RF modulation signal. The oscillation frequency of the RF modulation signal changes in accordance with the voltage inputted in control voltage terminal Vt. Frequency divider 1B divides the frequency of the RF modulation signal outputted from VCO 1A. Phase comparator 1C compares the phase of the signal outputted from frequency divider 1B and the phase of the reference signal, and outputs a signal in accordance with the phase difference. Loop filter 1D equalizes the output signal of phase comparator 1C.

Modulation sensitivity table 4 outputs a modulation signal based on the modulation data. D/A convertor 6 adjusts the gain in accordance with a gain control signal outputted from controller 3 and converts the modulation signal outputted from modulation sensitivity table 4 into analogue voltage. The modulation signal outputted from modulation sensitivity table 4 and a channel selection signal outputted from controller 3 are added in adder 2, and delta-sigma modulator 5 applies delta-sigma modulation to the composite signal and generates the frequency division ratio in frequency divider 1B. A/D convertor 7 converts the voltage value inputted in control voltage terminal Vt into a digital value and outputs the data thus converted into a digital value, to controller 3.

However, in the wideband modulation PLL arrangement that employs the two-point modulation scheme, the signal input timings in two-point modulation need to be synchronized, and, when a difference between the input timings in two-point modulation develops, this may result in deterioration in modulation accuracy (e.g. EVM: Error Vector Magnitude).

For example, if a mobile telephone is made incorporating a wideband modulation PLL arrangement that employs the two-point modulation scheme in the communicating section, an input timing difference such as mentioned above occurs due to variations in the characteristics of individual electronic components.

In addition, when the mobile telephone is in use, the above input timing difference occurs when the battery is activated, when the power supply fluctuates, when the temperature changes, and in equivalent circumstances. In addition, if the mobile telephone employs the TDMA (Time Division Multiple Access) scheme, the above input timing difference occurs at the beginning of the time slot, when the power supply fluctuates, when the temperature changes, and in equivalent circumstances. Such input timing difference need to be corrected for improved modulation accuracy. However, there is not yet a particular method that enables input timing difference adjustment.

SUMMARY OF THE INVENTION

It is therefore an object of the present invention to provide a two-point frequency modulation apparatus, wireless transmitting apparatus, and wireless communication apparatus that reduces input timing differences in two-point modulation and improves modulation accuracy.

In accordance with an aspect of the present invention, there are provided: a PLL circuit; a frequency division ratio setter that sets a frequency division ratio in a frequency divider in the PLL circuit based on a first digital baseband signal and a carrier signal; a signal adder that adds a second digital baseband signal to an output signal of a loop filter; a delay index calculator that calculates a delay index based on a magnitude of change in the amplitude of the signal combining the output signal and the second digital baseband signal; and a delay adjuster that shifts the phase of one of the first digital baseband signal and the second digital baseband signal according to the delay index so as to reduce a phase difference between the first digital baseband signal and the second digital baseband signal, and, with these, the present invention calculates the delay index based on the magnitude of change in the amplitude of the signal combining the output signal of the loop filter in the PLL circuit employing the two-point modulation scheme and the digital baseband signals, shifts the phase of one of the digital baseband signals supplied to the two-point modulation section according to the delay index, reduces the phase difference between the digital baseband signals, and thus achieves the above-noted object of the present invention.

BRIEF DESCRIPTION OF THE DRAWINGS

The above and other objects and features of the invention will appear more fully hereinafter from a consideration of the following description taken in connection with the accompanying drawings in which:

FIG. 3 illustrates data of delay indexes in a storage table in a filter coefficient calculator in the two-point frequency modulation apparatus of FIG. 2;

DETAILED DESCRIPTION OF PREFERRED EMBODIMENTS

Now, embodiments of the present invention will be described below in detail with reference to the accompanying drawings.

Embodiment 1

[Structure of Two-Point Frequency Modulation Apparatus]

Figure 1:
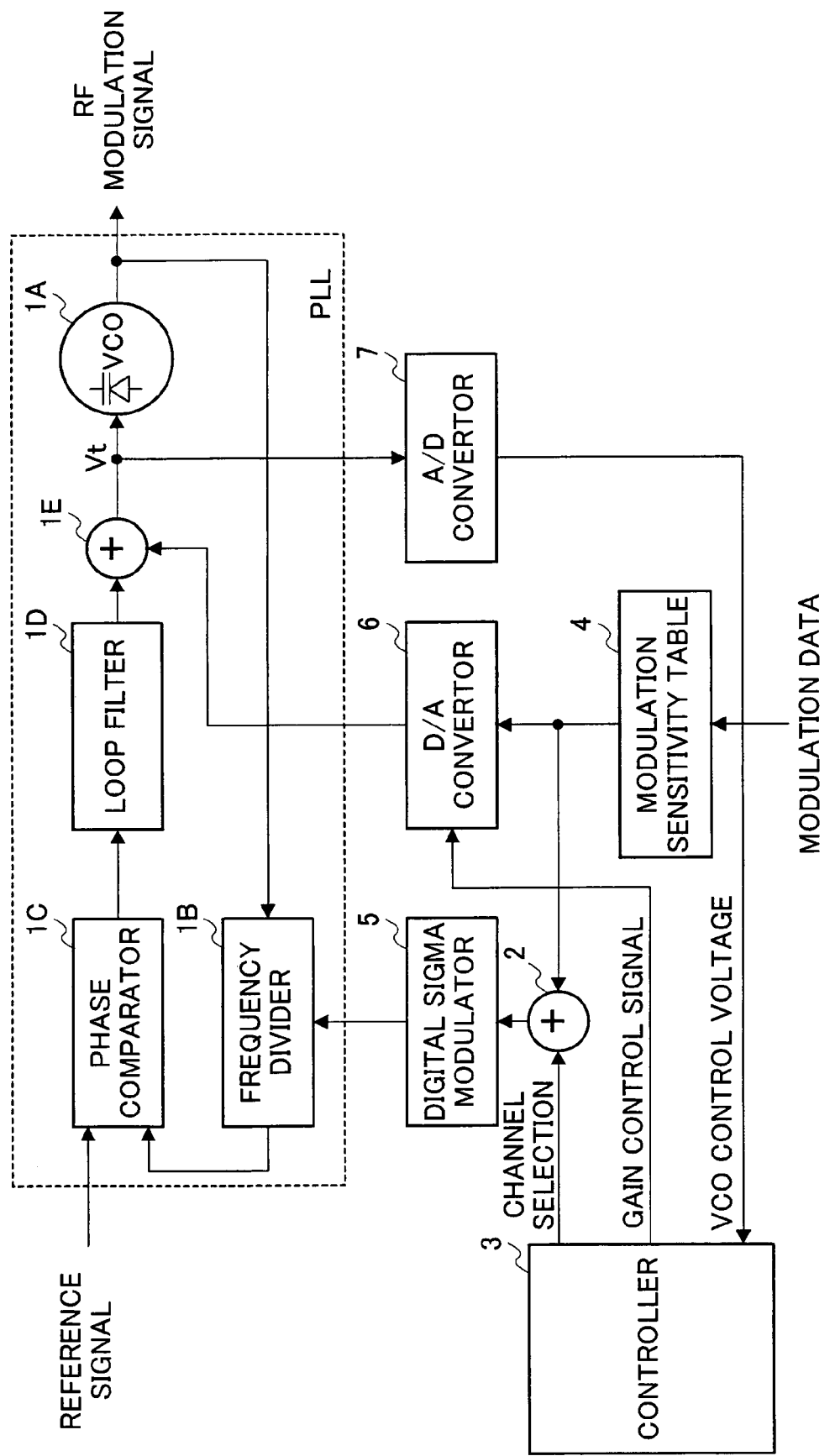
FIG. 1 is an overall configuration diagram of a conventional wideband modulation PLL.
Figure 2:
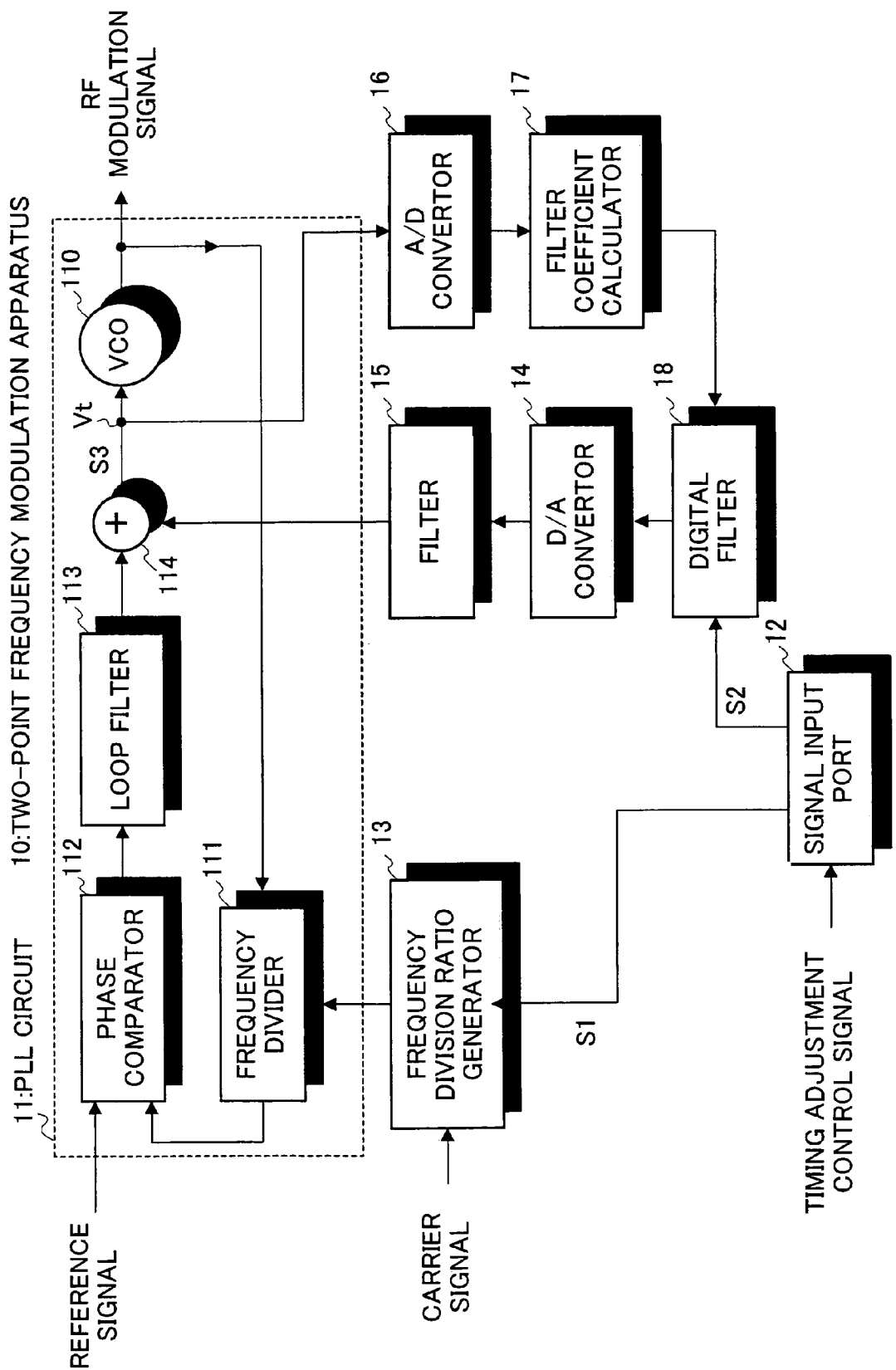
FIG. 2 is a block diagram showing a configuration of a two-point frequency modulation apparatus according to Embodiments 1 and 2 of the present invention.

As shown in FIG. 2, two-point frequency modulation apparatus 10 according to Embodiments 1 of the present invention has PLL circuit 11, which includes voltage controlled oscillator (VCO) 110, frequency divider 111, phase comparator 112, and loop filter 113. In addition, two-point frequency modulation apparatus 10 has: a frequency division ratio setter that sets the frequency division ratio in frequency divider 111 based on first digital baseband signal S1 and carrier signal; a signal adder that adds second digital baseband signal S2 to the output signal of loop filter 113; a delay index calculator that calculates the delay index in accordance with the magnitude of change in the amplitude of the composite signal combining the output signal of loop filter 112 and second digital baseband signal S2; and a delay adjustor that shifts the phase of second digital baseband signal S2 in accordance with the delay index and reduces the phase difference between first digital baseband signal S1 and second digital baseband signal S2.

Furthermore, two-point frequency modulation apparatus 10 has signal input port 12, from which first digital baseband signal S1 and second digital baseband signal S2 are outputted. In Embodiment 1, sine waves are in practice applicable to digital baseband signal S1 and digital baseband signal S2 outputted from signal input port 12. In input timing adjustment mode, in accordance with a timing adjustment control signal, signal input port 12 outputs second digital baseband signal S2 which is an inverted version of first digital baseband signal S1. To be more specific, signal input port 12 outputs a negative sine wave as first digital baseband signal S1 and a positive sine wave as second digital baseband signal S2. This signal inversion control can be implemented at ease by, for example, providing in signal input port 12 an inverter circuit that inverts first digital baseband signal S1 in accordance with a timing adjustment control signal.

VCO 110 in PLL circuit 11 is able to change the oscillation frequency according to the voltage inputted in control voltage terminal Vt. Phase comparator 112 compares the phase of the output signal of frequency divider 111 and the phase of the reference signal, and outputs a signal in accordance with the phase difference between the two signals. PLL circuit 11 further has adder 114 that adds second digital baseband signal S2 to the output signal of loop filter 113 (which is an output signal that is outputted from filter 15 after going through digital filter 18 and D/A convertor 14). Loop filter 113 equalizes the output signal of phase comparator 112.

The frequency division ratio setter includes frequency division ratio generator 13 in its configuration. This frequency division ratio generator 13 sets the frequency division ratio based on first digital baseband signal S1 and carrier signal, and outputs the frequency division ratio to frequency divider 111. In accordance with the output signal of frequency division ratio generator 13, frequency divider 111 generates a modulation signal within the PLL bandwidth.

The signal adder includes D/A convertor 14 that converts second digital baseband signal S2 into an analogue signal, filter 15 that removes the harmonic component of the output signal of D/A convertor 14, and adder 114 that adds the output signal of filter 15 to the output signal of loop filter 113.

This signal adder adds the output signal of filter 15 (i.e. second digital baseband signal S2) to the output signal of loop filter 113, and thereby modulates the input signal of VCO 110 outside the PLL bandwidth.

As shown in FIG. 2, the delay index calculator includes filter coefficient calculator 17 in its configuration. Embodiment 1 is designed to use the signal obtained by adding the output signal of filter 15 to the output signal of loop filter113—that is, the output signal of adder 114—as a digital signal. Consequently, the delay index calculator further has A/D convertor 16. A/D convertor 16 receives as input the output signal of adder 114 in PLL circuit 11, and so A/D convertor 16 is connected to the circuit between adder 114 and VCO 110. In the equivalent circuit, A/D convertor 16 is connected to the same point as voltage controlled terminal Vt.

Filter coefficient calculator 17 has table 17M shown in FIG. 3. Filter coefficient calculator 17 is able to calculate delay indexes according to the magnitude of change in the amplitude of the output signals of adder 114, and delay indexes calculated thus are stored as information in storage table 17M.

Figure 4:
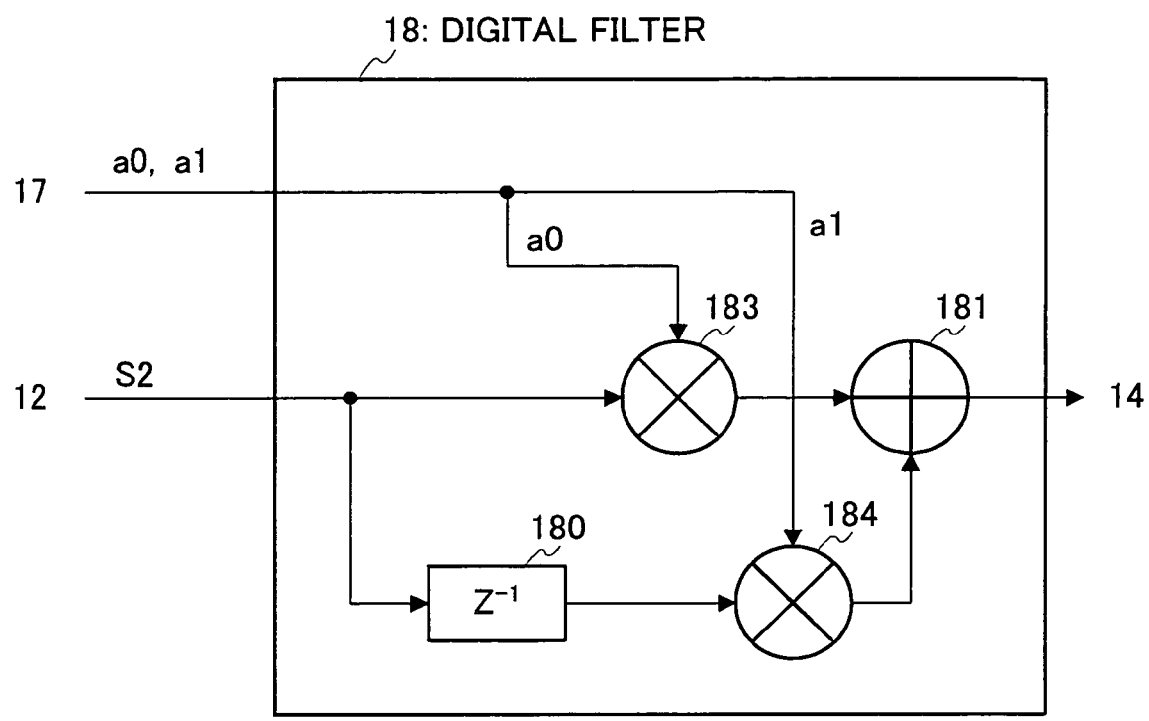
FIG. 4 is a block diagram showing a configuration of a digital filter in the two-point frequency modulation apparatus of FIG. 2.

As shown in FIG. 2, the delay adjustor includes digital filter 18 in its configuration in Embodiment 1. As shown in FIG. 4, this digital filter 18 includes delay element (i.e. Z-transformer) 180, adder 181, and multipliers 183 and 184.

In digital filter 18, second digital baseband signal S2 that is outputted from signal input port 12 is inputted in multiplier 183 and also inputted in multiplier 184 via delay element 180. Meanwhile, the delay index outputted from filter coefficient calculator 17 (tap coefficients a0 and a1, in this embodiment) are inputted into multipliers 183 and 184, respectively.

As shown in FIG. 3, filter coefficient calculator 17 of this embodiment is designed to output tap coefficients a0 and a1 in accordance with the delay index. To be more specific, tap coefficient a0 is outputted to multiplier 183 and tap coefficient a1 is outputted to multiplier 184. Multiplier 183 multiplies second digital baseband signal S2 by tap coefficient a0 and outputs the result to adder 181. Multiplier 184 multiplies second digital baseband signal S2, which has gone through delay element 180, by tap coefficient a1 and outputs the result to adder 181. Adder 181 adds the output signals of multipliers 183 and 184, and outputs a delay-adjusted output signal (i.e. second digital baseband signal S2) to adder 114 in PLL circuit 11 through D/A convertor 14 and filter 15.

[Method of Input Timing Difference Adjustment in Two-Point Frequency Modulation Apparatus]

Next, the method of adjusting the difference between input timings difference in two-point modulation in above-described two-point frequency modulation apparatus 10 will be described.

First, two-point frequency modulation apparatus 10 is configured in timing adjustment mode to adjust the difference between input timings in two-point modulation due to variations in the characteristics of individual electronic components in loop filter 113 and filter 15 shown in FIG. 2, fluctuations of power supply when the battery is activated, changes in temperature, and so on.

Timing adjustment mode is configured upon input of a timing adjustment control signal in signal input port 12. When the timing adjustment control signal is inputted, signal input port 12 outputs first digital baseband signal S1 (e.g., negative sine wave) and an inverted version of this signal as second digital baseband signal S2 (e.g., positive sine wave).

First digital baseband signal S1 is inputted in frequency division ratio generator 13. Frequency division ratio generator 13 sets the frequency division ratio based on first digital baseband signal S1 and carrier signal, and outputs the frequency division ratio to frequency divider 111.

In PLL circuit 11, VCO 110 oscillates an RF modulation signal, and this RF modulation signal is frequency-divided and inputted in frequency divider 111. In accordance with the output signal of frequency division ratio generator 13, frequency divider 111 generates a modulation signal within the PLL bandwidth. The output signal of frequency divider 111 is inputted in phase comparator 112. Phase comparator 112 compares the phase of the output signal of frequency divider 111 and the phase of the reference signal, and outputs a signal in accordance with the phase difference between the two signals. The output signal of phase comparator 112 is inputted in loop filer 113. This loop filter 113 equalizes the output signal of phase comparator 112. The output signal of loop filter 113 is inputted in adder 114.

Meanwhile, second digital baseband signal S2 that is outputted from signal input port 12 is inputted in D/A convertor 14 via digital filter 18. D/A convertor 14 converts second digital baseband signal S2 from an analogue signal into a digital signal, and this converted second digital baseband signal S2 is outputted to filter 15. Filter 15 removes the harmonic component of the output signal of D/A convertor 14, and this output signal is outputted to adder 114 in PLL circuit 11. Adder 114 adds the output signal of filter 15 and the output signal of loop filter 113, and the composite output signal is outputted to VCO 110 in accordance with the voltage inputted in control voltage terminal Vt.

Figure 5:
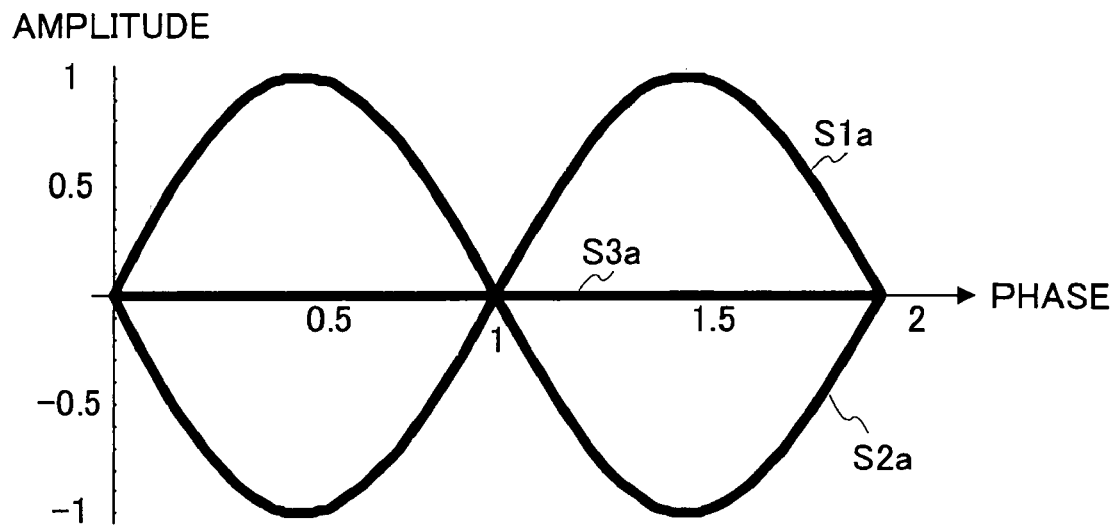
FIG. 5 illustrates output waveforms according to Embodiment 1.
Figure 6:
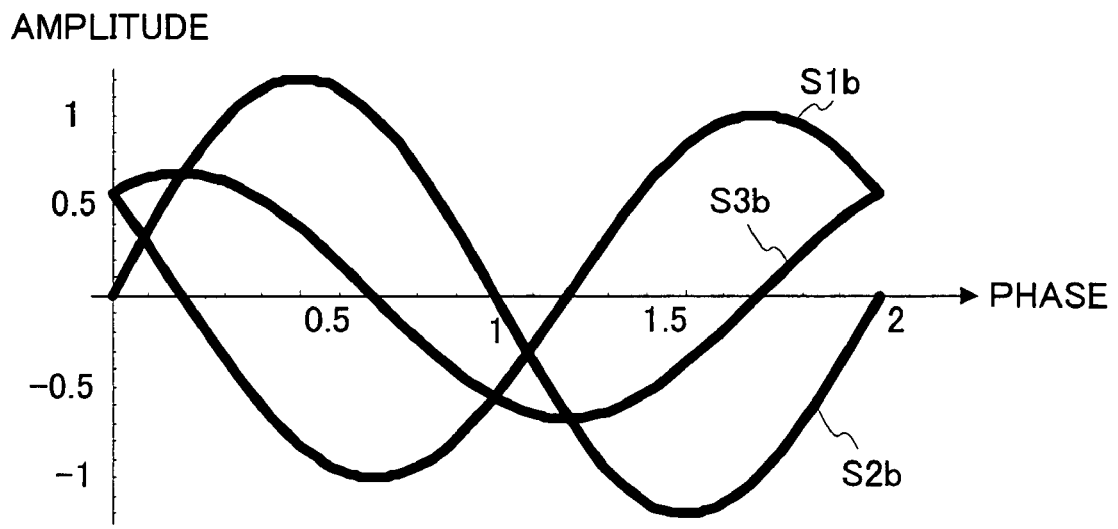
FIG. 6 illustrates output waveforms according to Embodiment 1.

Now, in two-point frequency modulation apparatus 10, if the input timings in two-point modulation match, when, as shown in FIG. 5, output signal S2a of filter 15 (e.g. positive sine wave) is added to output signal S1a of loop filter 113 (e.g. negative sine wave), the amplitude of output signal S3a of adder 114 becomes zero because output signal S1a and output signal S2a have no phase difference and cancel out. On the other hand, if the input timings do not match, when, as shown in FIG. 6, output signal S2b of filter 15 is added to output signal S1b of loop filter 113, due to the phase difference between output signal S1b and output signal S2b, output signal S3b of adder 114 has an amplitude that in proportion combines output signal S1b and output signal S2b.

Figure 20:
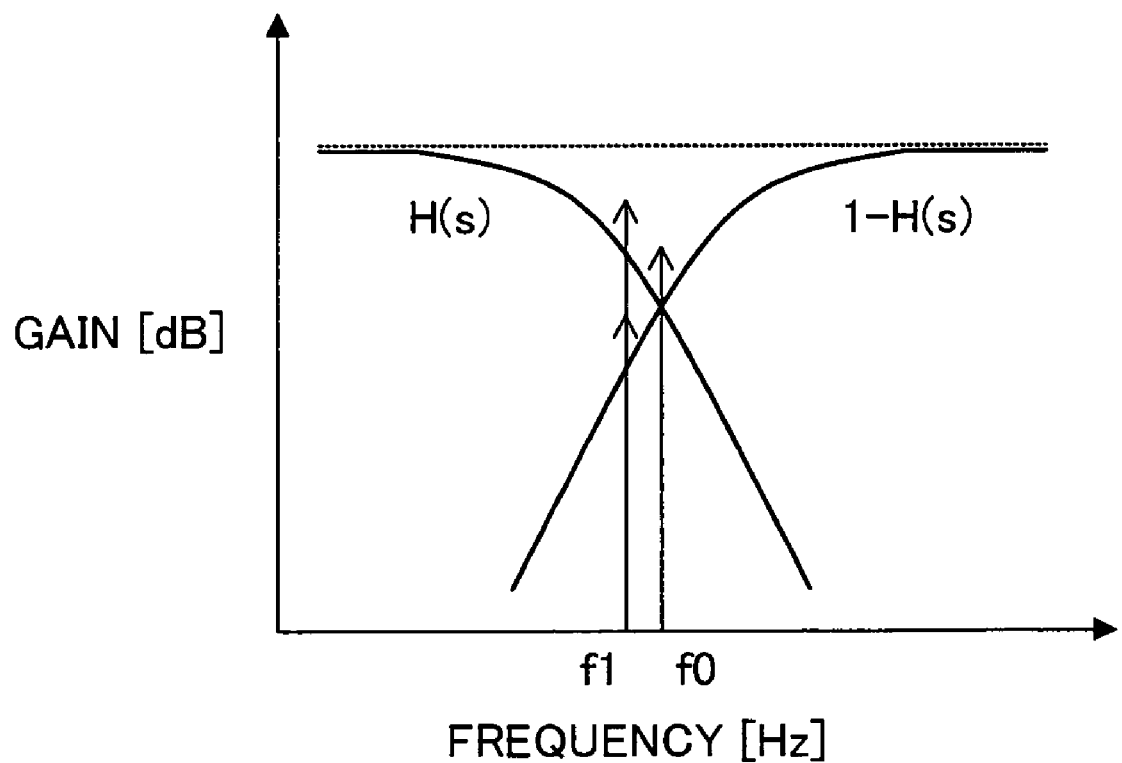
FIG. 20 is a diagram showing frequency-gain characteristics according to Embodiment 1 of the present invention.

Now, if the sine waves (e.g. positive and negative sine waves) at frequency f0 where the transfer function H(s) and the transfer function 1-H(s) cross, are selected as first digital baseband signal S1 (i.e. phase modulation data) and second digital baseband signal S2 (i.e. phase modulation data) inputted from signal input port 12, the value of output signal S3 can be made zero when the timings in two-point modulation match, as shown in FIG. 5. However, various factors including fluctuations in loop filter 113 and others make it difficult to select frequency f0. So, in practice, the frequency of the sine waves that are inputted diverts from frequency f0, such as frequency f1 shown in FIG. 20. Individual modulation inputs thus produce differences in gain, and, consequently, even when the timings of first digital baseband signal S1 and second digital baseband signal S2 match, the amplitude of output signal S3 does not become zero. In addition, as mentioned earlier, the greater the difference between the timings of first digital baseband signal S1 and second digital baseband signal S2, the greater the amplitude of output signal S3. Consequently, the delay index calculator determines the delay index that minimizes the amplitude of output signal S3 and thereby performs delay adjustment.

The delay index calculator determines the delay index based on the magnitude of change in the amplitude of output signal S3 of adder 114 in PLL circuit 11, following the steps below:

First, assuming that the input timings in two-point modulation match, tap coefficients a0 (8/8) and a1 (0/8), corresponding to delay index 0 in storage table 17M in FIG. 4, are outputted from filter coefficient calculator 17 as initial values. At this time, digital filter 18 outputs second digital baseband signal S2 that practically is not delay adjusted.

Figure 8:
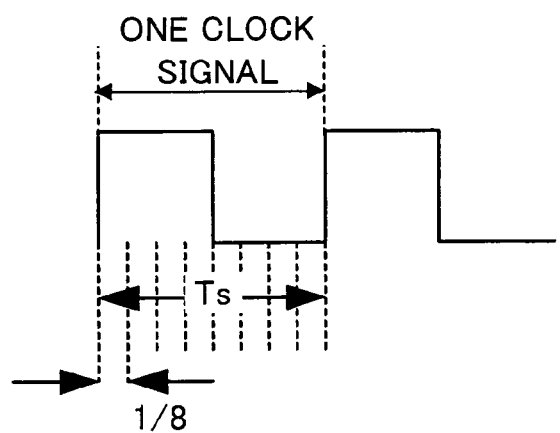
FIG. 8 illustrates delay adjustment interval according to Embodiment 1.

Now, the delay indexes stored in storage table 17M in filter coefficient calculator 17 in FIG. 3 divide one clock signal (from one rise to the next) equally into eight, with reference numerals "0" "1 " "2" . . . "8" assigned respectively, as shown in FIG. 8. The TS ratio represents the ratio of delay interval in proportion to one clock signal. For example, the first delay index 0 has the Ts ratio 0/8 and is a coefficient that in effect does not delay adjust second digital baseband signal S2. The delay index 1 has the TS ratio 1/8 and is a coefficient that delay adjusts second digital baseband signal S2 by shifting the phase of second digital baseband signal S2 by 1/8 of a clock signal. The delay index 2 has the TS ratio 2/8 and is a coefficient that delay adjusts second digital baseband signal S2 by shifting the phase of second digital baseband signal S2 by 2/8 of a clock signal. As for other the delay index is similar, and the maximum delay index 8 has the TS ratio 8/8 and is a coefficient that delay adjusts second digital baseband signal S2 by shifting the phase of second digital baseband signal S2 by 8/8 of a clock signal, that is, by one whole clock signal.

In Embodiment 1, a clock signal is divided into eight for ease of explanation. Basically, it is preferable to divide by multiples of 2. By dividing a clock thus, it is possible to enhance sensitivity and accuracy.

Figure 7:
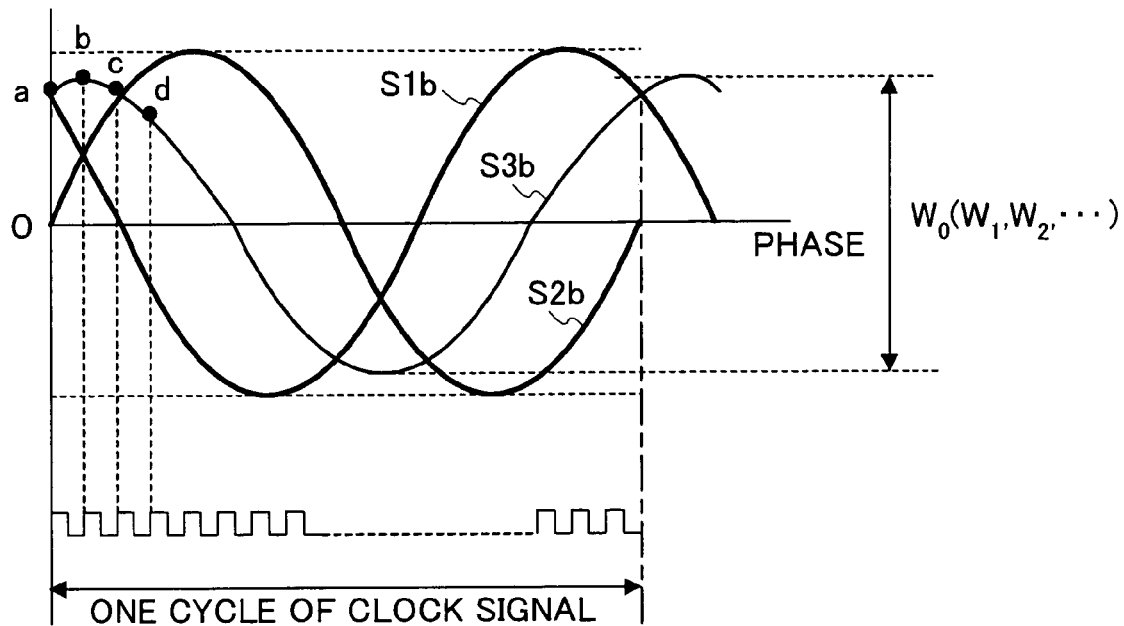
FIG. 7 illustrates output waveforms according to Embodiment 1.

Second digital baseband signal S2, which is outputted from digital filter 18 and which in effect is not delay adjusted, is outputted to filter 15 via D/A convertor 14, and, as shown in FIG. 7, output signal S2b is outputted from filter 15. Output signal S2b is added to output signal S1b of loop filter 113 in adder 114, and adder 114 sends out output signal S3b as shown in FIG. 7.

A/D convertor 16 converts the analogue data (i.e. a, b, c, d . . . ) in one cycle of output signal S3b (sine wave), which is outputted from adder 114, into digital data, on a per clock signal basis (e.g. every rise of the clock signal). The digital data converted thus is taken in filter coefficient calculator 17. In filter coefficient calculator 17, the digital data taken in and the digital data taken in one clock signal earlier are compared, and the maximum value and the minimum value of the digital data in comparison are determined, and, in the end, the maximum amplitude value $W_0$ of output signal S3b is calculated.

Figure 9:
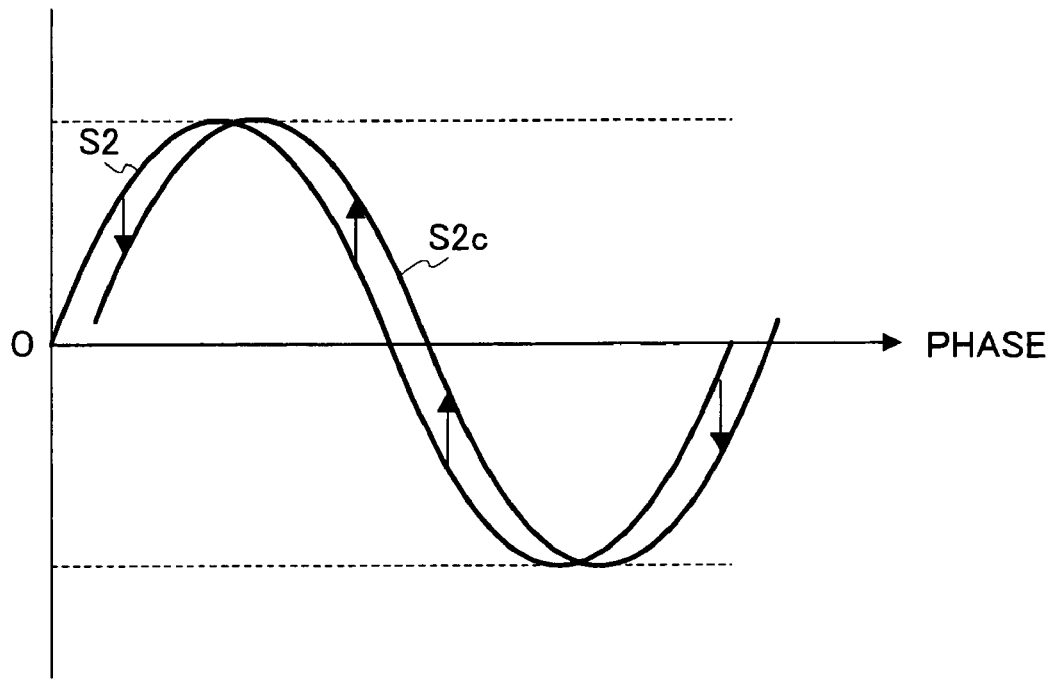
FIG. 9 illustrates output waveforms according to Embodiment 1.

When filter coefficient calculator 17 calculates the maximum amplitude value—in other words, when detection is made that input timings do not match—the delay index 0 in storage table 17M is changed to the delay index 1. In response to the change to the delay index 1, filter coefficient calculator 17 outputs tap coefficients a0 (7/8) and a1 (1/8) corresponding to the delay index 1. At this time, digital filter 18 applies a shift in a direction that delays the phase of second digital baseband signal S2 by 1/8 of a clock signal shown in FIG. 8. As shown in FIG. 9, second digital baseband signal S2 is changed the values in the amplitude direction by changing the tap coefficients a0 and a1, thereby second digital baseband signal S2 is shifted the phase. Consequently digital filter 18 can output second digital baseband signal S2c delayed by 1/8 of a clock signal.

Second digital baseband signal S2c generated in digital filter 18 is inputted in filter 15 via D/A convertor 14. The output signal of this filter 15 and the output signal of loop filter 113 are outputted to adder 114. As mentioned earlier, adder 114 calculates the maximum amplitude value $W_1$ from the output signal combining the two output signals as shown in FIG. 7.

Figure 10:
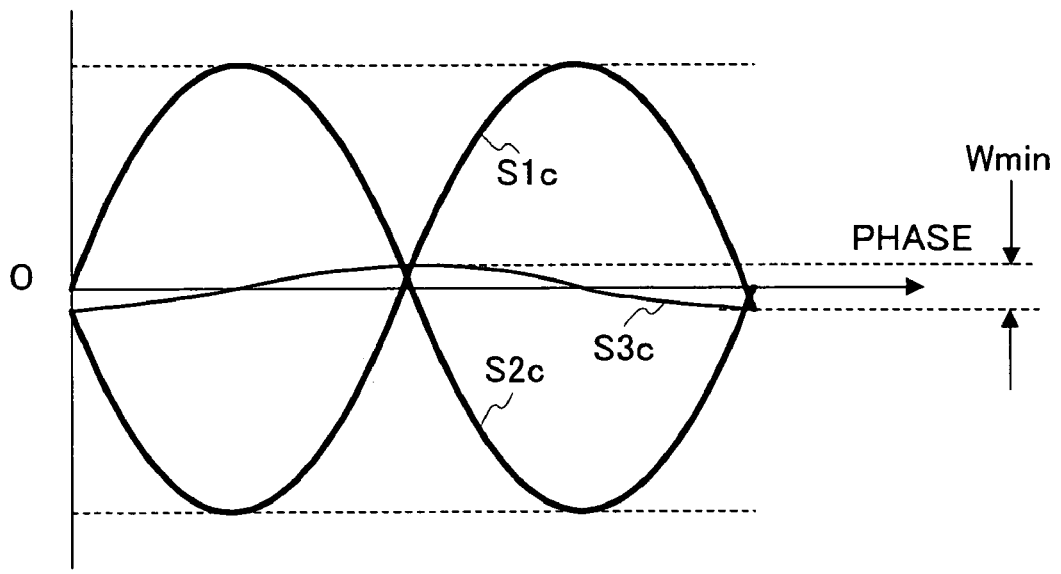
FIG. 10 illustrates output waveforms according to Embodiment 1.

Filter coefficient calculator 17 compares the maximum amplitude value $W_0$ of the output signal calculated earlier, and the maximum amplitude value $W_1$ of the output signal calculated later. Then, as shown in FIG. 10, the above sequence of steps is repeated until the amplitude of output signal S3c becomes equal or equivalent to the minimum value $W_{min}$, thereby determining the delay index that makes the amplitude of output signal S3c the minimum value $W_{min}$. The delay indexes determined thus (i.e. tap coefficients a0 and a1) are held in digital filter 18 for use in adjusting the input timing difference in two-point modulation.

Thus, tap coefficients a0 and a1 that minimize the input timing difference in two-point modulation are detected and held. In actual two-point modulation processing (i.e. in normal mode), the baseband signals to be transmitted is input into frequency division ratio generator 13 and digital filter 18 via signal input port 12.

Figure 11:
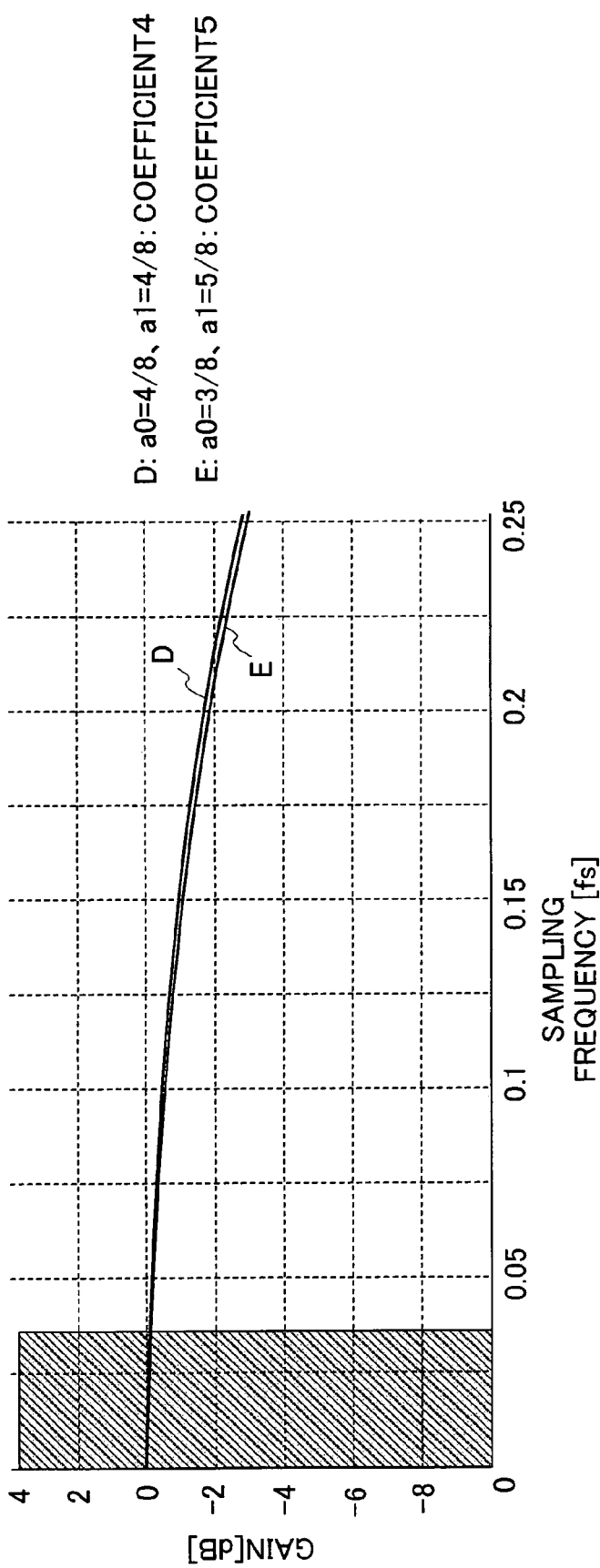
FIG. 11 illustrates frequency characteristics of digital filters.

FIG. 11 shows the frequency characteristics of digital filter 18. In FIG. 11, the horizontal axis is the sampling frequency [fs] and the vertical axis is the gain [dB]. Frequency characteristic D represents the frequency characteristics of digital filter 18, where the delay index is configured to 4, that is, the tap coefficients are configured to a0 (4/8) and a1 (4/8). Frequency characteristic E represents the frequency characteristics of digital filter 18, where the delay index is configured to 5, that is, the tap coefficients are configured to a0 (3/8) and a1 (5/8). In this embodiment, digital filter 18 used for delay adjustment of second digital baseband signal S2 is for sufficiently lower frequencies than the sampling frequency. As shown in FIG. 11, digital filter 18 has flat characteristics in the lower frequency region of the sampling frequency (shown as the hatched area), therefore digital filter 18 does not change the absolute amplitude of second digital baseband signal S2 that passes digital filter 18.

[System Configuration of Wireless Transmitting Apparatus]

Figure 12:
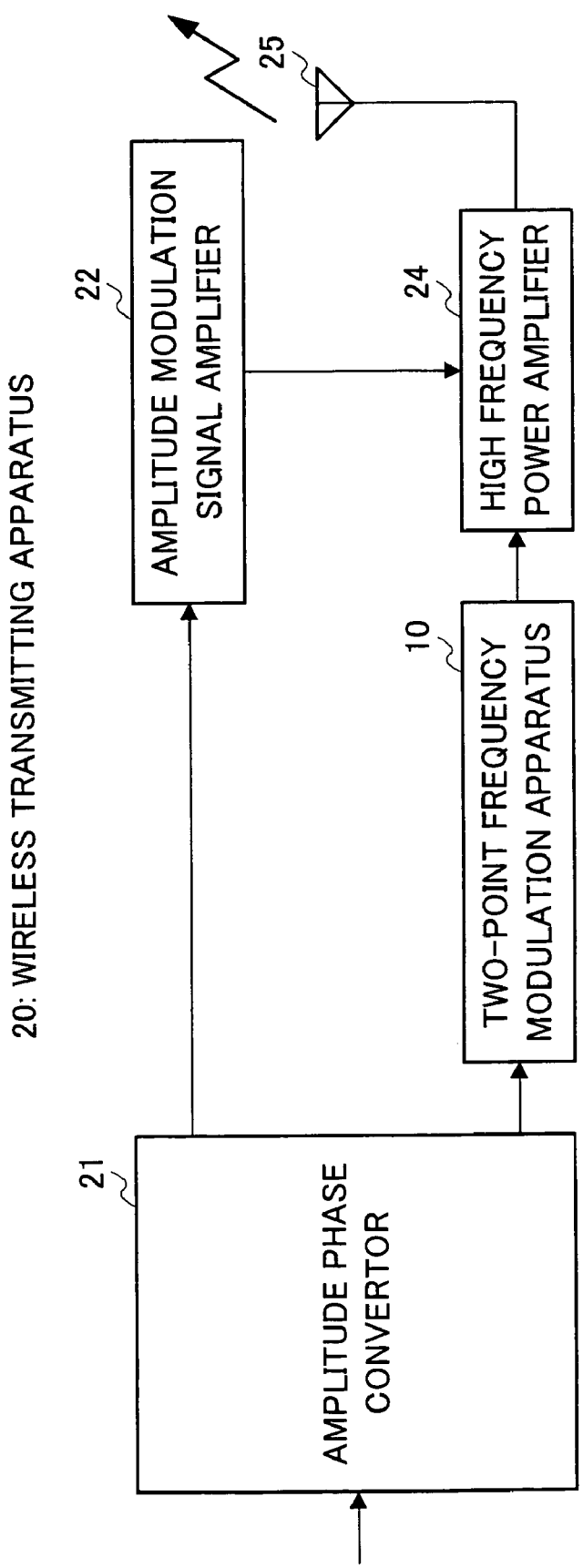
FIG. 12 is a system block diagram showing a wireless communication apparatus, which employs the polar modulation transmission scheme and in which the two-point frequency modulation apparatus of FIG. 2 is incorporated.

FIG. 12 shows a configuration where two-point frequency modulation apparatus of the present embodiment is mounted in a wireless transmitting apparatus that employs the polar modulation scheme. As shown in FIG. 12, wireless transmitting apparatus 20 has amplitude phase convertor 21, amplitude modulation signal amplifier 22, two-point frequency modulation apparatus 10 (i.e. frequency synthesizer), which was described earlier, high frequency power amplifier 24, and antenna 25. Amplitude phase convertor 21 inputs a baseband modulation signal formed with the I (In-phase) component and Q (Quadrature) component. This amplitude phase convertor 21 outputs the amplitude component of the baseband modulation signal—that is, $\sqrt{I^2+Q^2}$—as an amplitude modulation signal to amplitude modulation signal amplifier 22, and outputs the phase component of the baseband modulation signal (for example, the angle that the modulation symbol and the I axis form) as a baseband phase modulation signal, to two-point frequency modulation apparatus 10.

Two-point frequency modulation apparatus 10 modulates a carrier signal by (i.e. carrier frequency data) by the baseband phase modulation signal (first digital baseband signal S1) and thereby generates an RF modulation signal (high frequency phase modulation signal) and outputs this to high frequency power amplifier 24. To be more specific, as described above, in a state where optimal tap coefficients a0 and a1 that minimize the input timing difference in two-point modulation are held in digital filter 18, digital baseband signal S1 to be transmitted is input to frequency division ratio generator 13 and digital filter 18, and the two-point frequency modulation is performed.

High frequency power amplifier 24 is a non-linear amplifier and the supply voltage value in high frequency power amplifier 24 is set according to the amplitude modulation signal amplified in amplitude modulation signal amplifier 22. By this means, the signal, obtained by multiplying the supply voltage value by the RF modulation signal outputted from two-point frequency modulation apparatus 10, is amplified by the gain of high frequency power amplifier 24 and outputted from high frequency power amplifier 24 as a transmission signal. The transmission signal is transmitted from antenna 25.

Thus, with wireless transmitting apparatus 20 that employs the polar modulation transmission scheme, the RF signal inputted in high frequency power amplifier 24 is made a flat envelope signal that has no varying component in amplitude directions, so that a non-linear amplifier can be used in a highly efficient manner as high frequency power amplifier 24.

As described above, according to two-point frequency modulation apparatus 10 of Embodiment 1, the magnitude of change in the amplitude of the signal (i.e. the output signal of adder 114)—obtained by adding the output signal of filter 15 to the output signal of loop filter 113—is detected, and the phase of second digital baseband signal S2 is shifted (delay-adjusted) according to the magnitude of change in the amplitude of the output signal, thereby reducing the phase difference between first digital baseband signal S1 and second digital baseband signal S2. Consequently, two-point frequency modulation apparatus 10 reduces the input timing difference in two-point modulation and improves the modulation accuracy.

In addition, two-point frequency modulation apparatus 10 according to Embodiment 1 is designed to detect the magnitude of change in the amplitude of the signal obtained by adding the output signal of filter 15 to the output signal of loop filter 113, adjust the tap coefficients in digital filter 18 in accordance with the magnitude of change in the amplitude, and shift the phase of second digital baseband signal S2, so that the phase shift amount can be set independent of the frequency speed of the clock signal, and the phase of second digital baseband signal can be shifted in finer phase shift amounts than the frequency speed of the clock signal, and therefore the phase difference between the first digital baseband signal S1 and second digital baseband signal S2 can be reduced. Consequently, two-point frequency modulation apparatus 10 even further reduces the input timing difference in two-point modulation and improves the modulation accuracy.

Embodiment 2

A case will be described here with Embodiment 2 of the present invention where, in two-point frequency modulation apparatus 10 of Embodiment 1, the method of inverting digital baseband signals in input timing adjustment mode in two-point modulation is changed.

Figure 13:
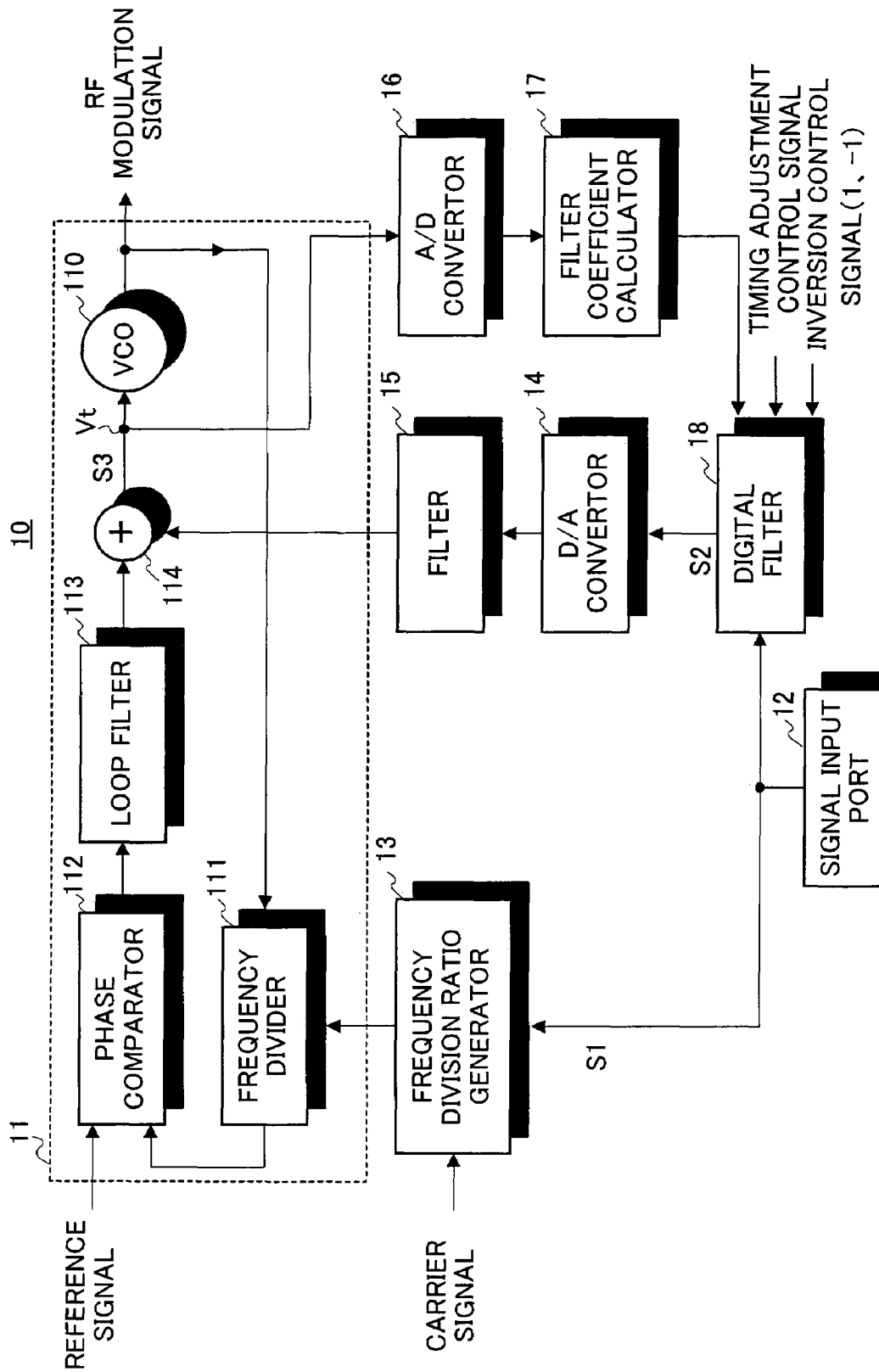
FIG. 13 is a block diagram showing a two-point frequency modulation apparatus according to Embodiment 2 of the present invention.

As shown in FIG. 13, two-point frequency modulation apparatus 10 according to Embodiment 2 has signal input port 12 that outputs digital baseband signal S1 to frequency division ratio generator 13 and digital filter 18, and digital filter 18 (i.e. delay adjustor) that, in input timing adjustment mode, generate second digital baseband signal S2, which is an inverted version of first digital baseband signal S1, and performs the delay adjustment of this second digital baseband signal S2 by way of phase shift and outputs the result.

Figure 14:
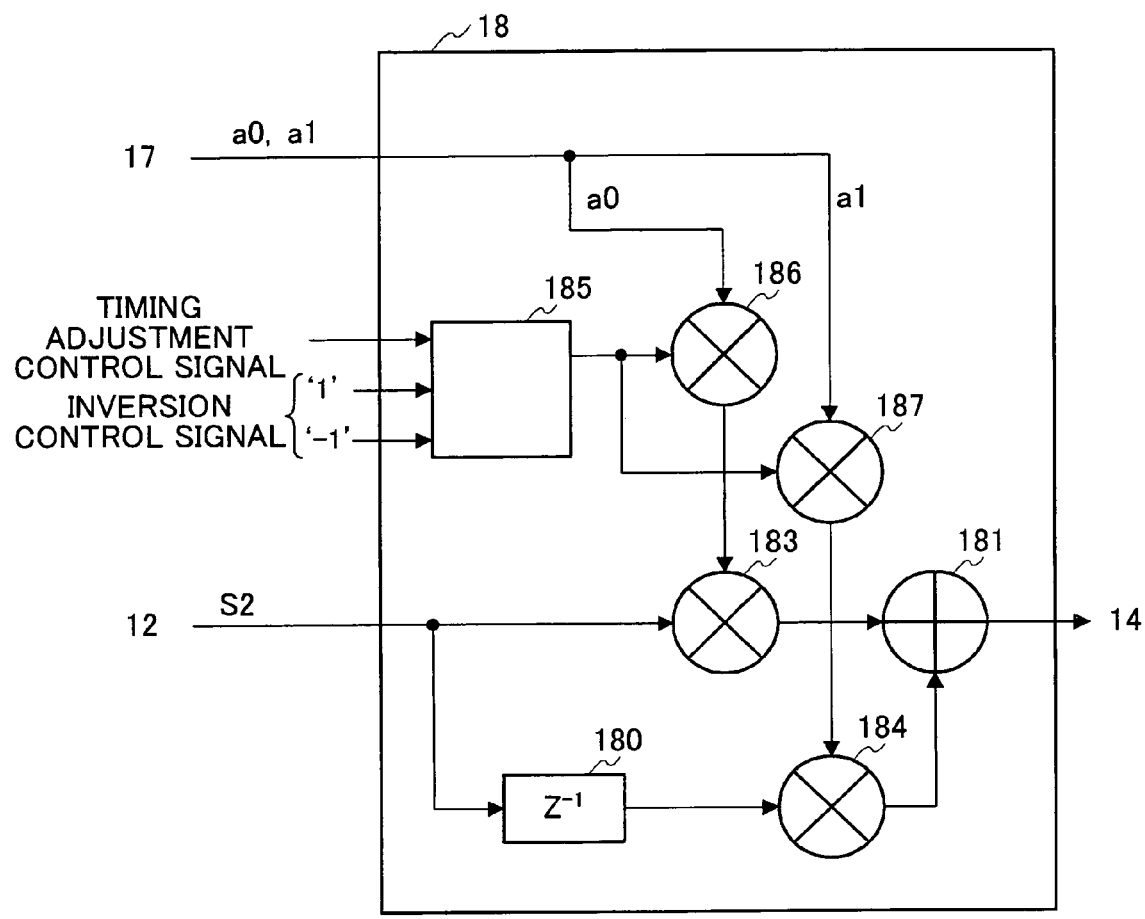
FIG. 14 is a bock diagram showing a digital filter in the two-point frequency modulation apparatus in FIG. 13.

As shown in FIG. 14, this digital filter 18 is fundamentally the same structure as that of digital filter 18 in two-point frequency modulation apparatus 10 according to Embodiment 1, except that this digital filter 18 further has timing adjustment mode switch 185 and multipliers 186 and 187.

Timing adjustment mode switch 185 is basically comprised of a selector. In this timing adjustment mode switch 185, a timing adjustment control signal for switching timing adjustment mode and inversion control signals of positive 1 and negative 1, which are multiplied upon output signals corresponding to tap coefficients a0 and a1 respectively and produce second digital baseband signal S2, which is an inverted version of S1, are inputted. In normal mode, timing adjustment mode switch 185 outputs an output signal of 1 to multipliers 186 and 187.

By this means, according to two-point frequency modulation apparatus 10 of Embodiment 2, without providing the digital baseband signal inversion function in signal input port 12, a simple configuration that has timing adjustment mode switch 185 and multipliers 186 and 187 in digital filter 18 makes it possible to generate inversion signals of digital baseband signals.

Embodiment 3

A case will be described here with Embodiment 3 of the present invention where the two-point frequency modulation apparatus of Embodiment 2 does not invert digital baseband signals in input timing adjustment mode.

Figure 15:
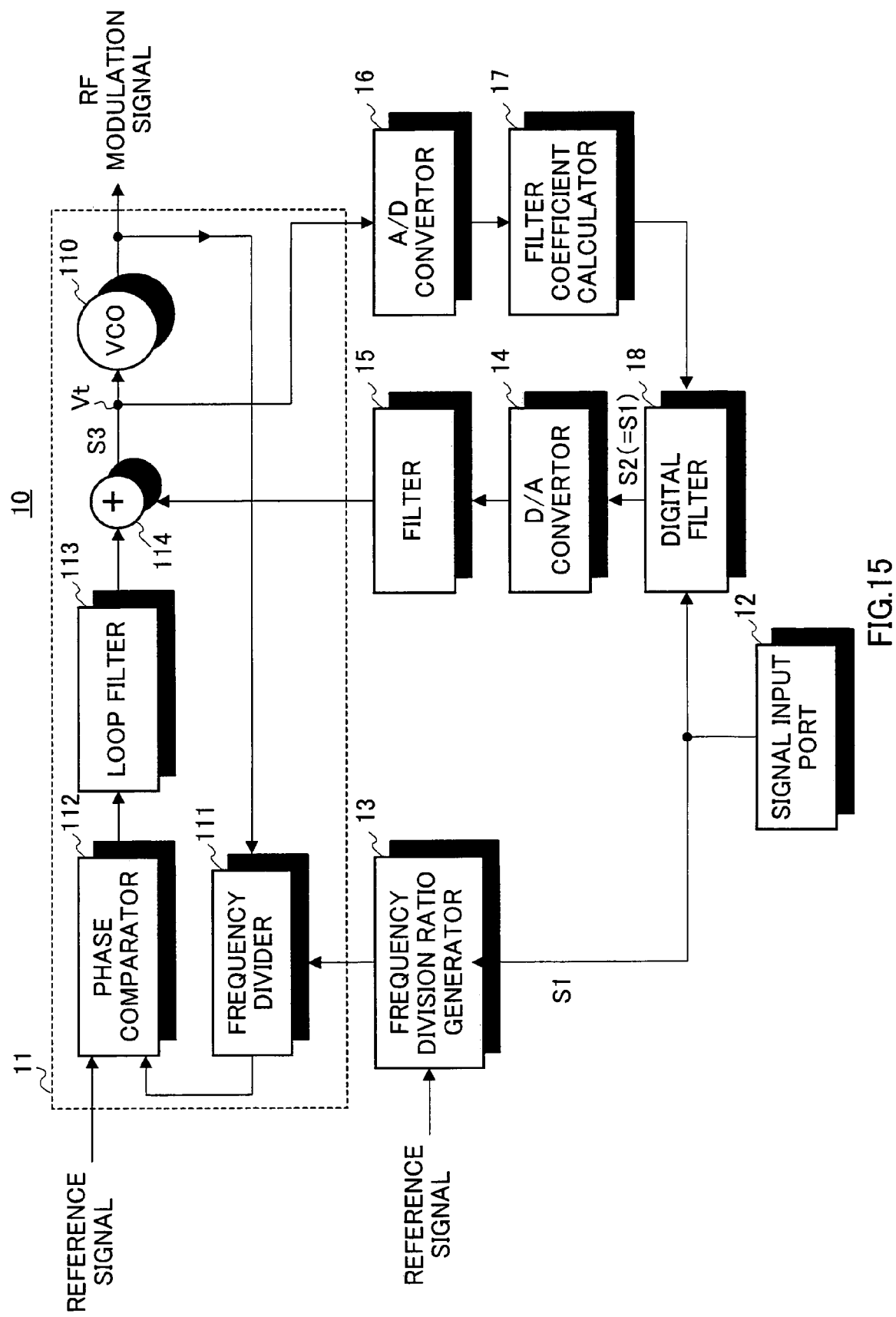
FIG. 15 is a block diagram showing a two-point frequency modulation apparatus according to Embodiment 3 of the present invention.

As shown in FIG. 15, two-point frequency modulation apparatus 10 according to Embodiment 3 has: signal input port 12, which basically has the same configuration as signal input port 12 of two-point frequency modulation apparatus 10 of Embodiment 2; and digital filter 18 which basically has the same configuration as digital filter 18 in two-point frequency modulation apparatus 10 of Embodiment 1. In this Embodiment, signal input port 12 outputs digital baseband signal S1 to frequency division ratio generator 13 and digital filter 18. In input timing adjustment mode and in normal mode, digital filter 18 generates and outputs second digital baseband signal S2 that is not inverted and that therefore is the same as first digital baseband signal S1.

Figure 16:
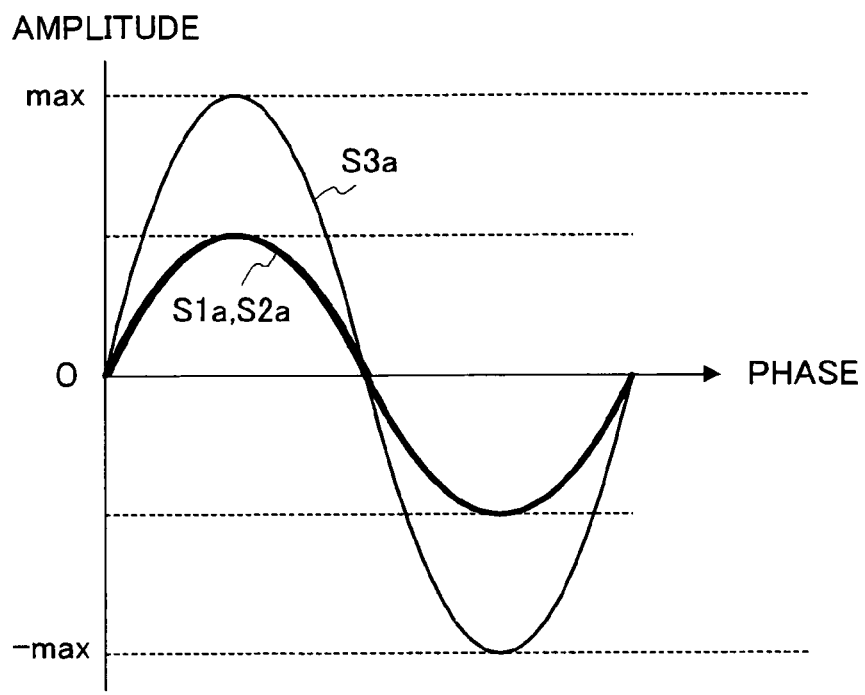
FIG. 16 illustrates output waveforms according to Embodiment 3.
Figure 17:
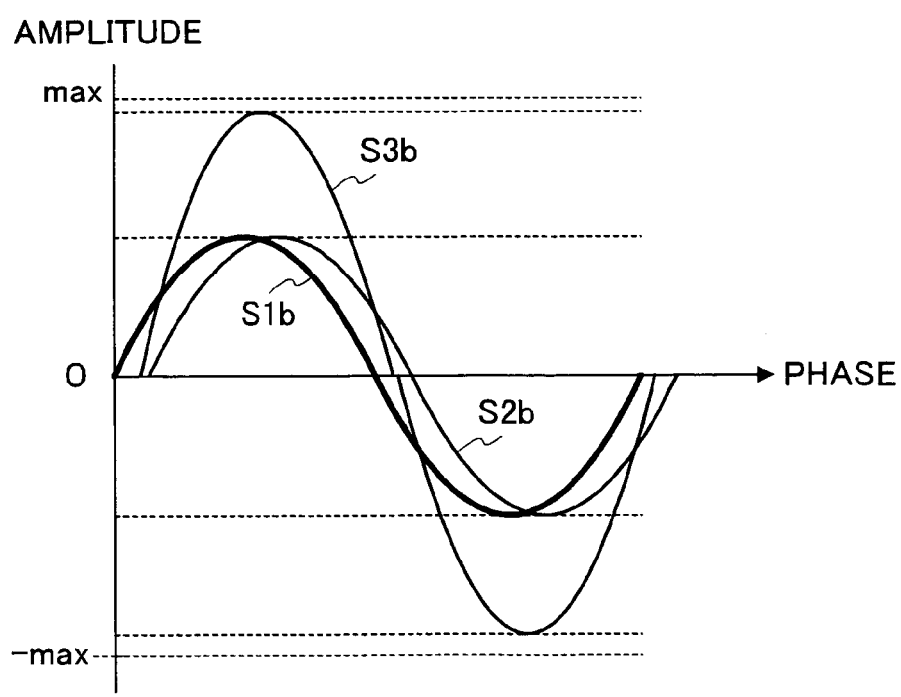
FIG. 17 illustrates output waveforms according to Embodiment 3.

Now, in two-point frequency modulation apparatus 10, if input timings in two-point modulation match, as shown in FIG. 16, when output signal of loop filter 113 (e.g. positive sine wave) and the output signal of filter 15 (e.g. positive sine wave) are added, output signal S3a of adder 114 becomes a signal of the maximum amplitude value that combines output signals S1a and S2a because these output signals S1a and S2a have no phase difference. That is, the amplitude of output signal S3a becomes the reverse of the amplitude of output signal S3a in Embodiment 1 shown in FIG. 5. On the other hand, if input timings do not match, as shown in FIG. 17, when output signal S2b of filter 15 is added to output signal S1b of loop filter 113, the amplitude of output signal S3b of adder 114 decreases due to the phase difference between output signal S1b and output signal S2b.

Based on the magnitude of change in the amplitude of output signal S3 of adder 114 in PLL circuit 11, the delay index calculator (i.e. filter coefficient calculator 17) is able to calculate the delay index (i.e. tap coefficients) following the same steps as in Embodiment 1, and, based on the delay index (i.e. tap coefficients), the delay adjustor (i.e. digital filter 18) is able to perform delay control of second digital baseband signal S2.

Consequently, two-point frequency modulation apparatus 10 of this embodiment is able to reduce the input timing difference in two-point modulation and improve modulation accuracy. In addition, with this two-point modulation apparatus 10, second digital baseband signal S2 does not need to be inverted in relation to first digital baseband signal S1, so that the circuit arrangement for producing inverted signals is not necessary.

Embodiment 4

Figure 18:
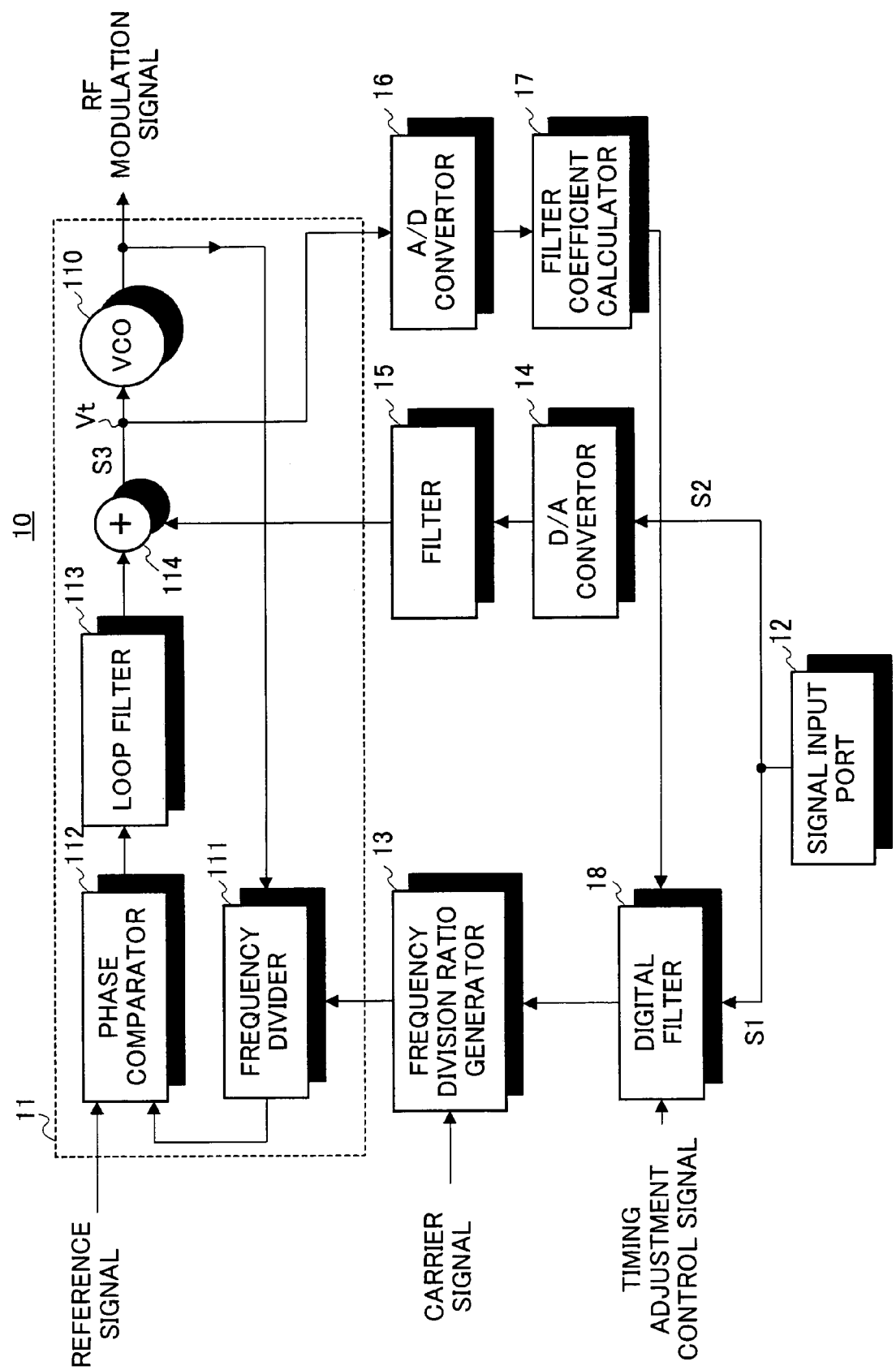
FIG. 18 is a block diagram showing a two-point frequency modulation apparatus according to Embodiment 4 of the present invention.

A case will be described here with Embodiment 4 of the present invention where digital filter 18 in two-point frequency modulation apparatus 10 according to Embodiment 2 shown in FIG. 13 is inserted between signal input port 12 and frequency division ratio generator 13. That is, as shown in FIG. 18, two-point frequency modulation apparatus 10 of Embodiment 4 has digital filter 18, which receives as input digital baseband signal S1 outputted from signal input port 12 and which outputs this first digital baseband signal S1 to frequency division ratio generator 13.

In Embodiment 1 to Embodiment 3, two-point frequency modulation apparatus 10 has digital filter 18 provided on the supply route of second digital baseband signal S2, and yet two-point frequency modulation apparatus 10 according to Embodiment 4 has digital filter 18 provided on the supply route of first digital baseband signal S1.

Thus, in input timing adjustment mode, two-point frequency modulation apparatus 10 according to Embodiment 4 performs delay control of first digital baseband signal S1, thereby determining and maintaining optimal tap coefficients that minimize the input timing difference in two-point modulation. Then, while two-point modulation process is in fact in progress (in normal mode), delay control of digital baseband signals inputted in frequency division ratio generator 13 is performed by means of digital filter 18 using the above optimal tap coefficients, thereby reducing the input timing difference in two-point modulation and improving modulation accuracy.

Embodiment 5

Figure 19:
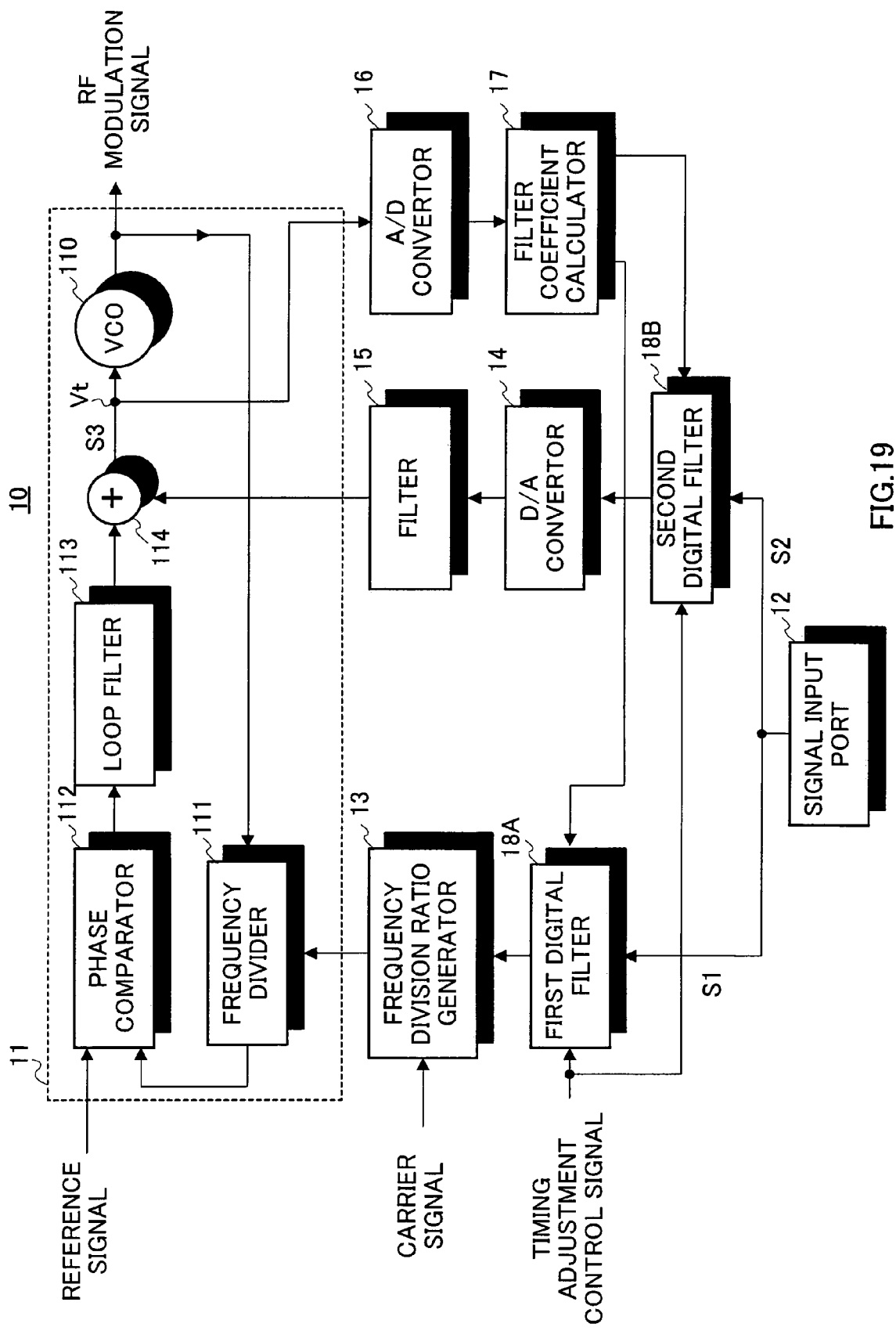
FIG. 19 is a block diagram showing a two-point frequency modulation apparatus according to Embodiment 5 of the present invention.

A case will be described here with Embodiment 5 of the present invention where two-point frequency modulation apparatus 10 of Embodiment 2 shown in FIG. 3 and two-point frequency modulation apparatus of Embodiment 4 shown in FIG. 18 are combined. That is, two-point frequency modulation apparatus 10 of Embodiment 5 has, as shown in FIG. 19, first digital filter 18A, which is inserted between signal input port 12 and frequency division ratio generator 13, and second digital filter 18B, which is inserted between signal input port 12 and D/A convertor 14. First digital filter 18A is provided on the supply route of first digital baseband signal S1 and performs delay control of this first digital baseband signal S1. Second digital filter 18B is provided on the supply route of second digital baseband signal S2 and performs delay control of this second digital baseband signal S2.

Thus, in input timing adjustment mode, two-point frequency modulation apparatus 10 according to Embodiment 5 performs delay control of first digital baseband signal S1 and second digital baseband signal S2, thereby determining and maintaining optimal tap coefficients that minimize the input timing difference in two-point modulation. Then, while two-point modulation process is in fact in progress (in normal mode), delay control of digital baseband signals inputted in frequency division ratio generator 13 is performed by digital filter 18A using the above optimal tap coefficients, and, likewise, delay control of digital baseband signals inputted in D/A convertor 14 is performed by digital filter 18B using the above optimal tap coefficients, thereby reducing the input timing difference in two-point modulation and improving modulation accuracy.

Embodiment 6

Although a case has been described above in Embodiment 1 with reference to FIG. 12 where two-point frequency modulation apparatus 10 of the present invention is mounted in a wireless transmitting apparatus that employs the polar modulation transmission scheme, the two-point frequency modulation apparatus of the present invention is by no means limited to this, and the two-point frequency modulation apparatus of the present invention is equally applicable to other, various transmitting apparatuses and various wireless communication apparatuses that have receiving functions.

Figure 21:
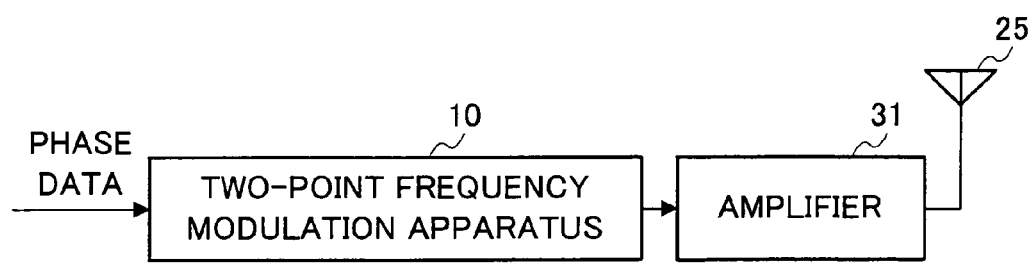
FIG. 21 is a block diagram showing a wireless transmitting apparatus according to Embodiment 6 of the present invention.

FIG. 21 illustrates an example of the configuration of a wireless transmitting apparatus with two-point frequency modulation apparatus 10 of the present invention. Wireless transmitting apparatus 30 has two-point frequency modulation apparatus 10 (i.e. frequency synthesizer) described earlier, amplifier 31, and antenna 25. As mentioned above, two-point frequency modulation apparatus 10 determines and holds optimal tap coefficients that minimize the input timing difference in two-point modulation, and thereafter, in normal transmission mode, performs delay adjustment of baseband signals using the above optimal tap coefficients by digital filter and modulates carrier signals (i.e. carrier frequency data) by the baseband signals, thereby generating RF modulation signals (i.e. high frequency phase modulation signals) and outputting them to amplifier 31. Transmission signals amplified in amplifier 31 are transmitted from antenna 25. By this means, owing to the use of two-point modulation apparatus 10 with improved modulation accuracy, wireless transmitting apparatus 30 is able to transmit high quality transmission signals.

Figure 22:
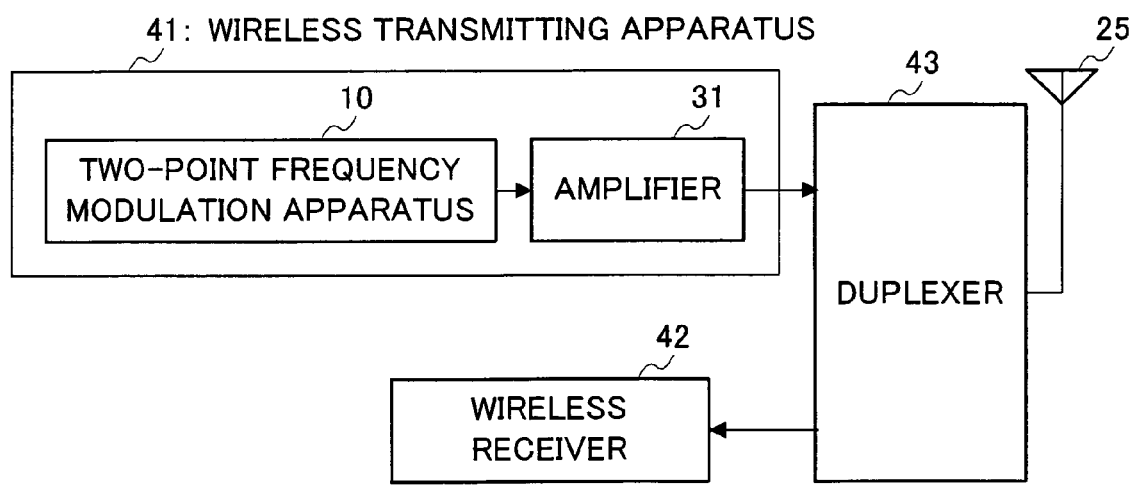
FIG. 22 is a block diagram showing a wireless communication apparatus according to Embodiment 6 of the present invention.

FIG. 22 shows a configuration of a wireless communication apparatus with the two-point frequency modulation apparatus of the present invention. Wireless communication apparatus 40 has wireless transmitter 41, which has two-point frequency modulation apparatus 10 and amplifier 31, wireless receiver 42 that performs predetermined receive processing including demodulation processing of received signals, duplexer 43 which switches transmission signals and received signals, and antenna 25. By this means, owing to the use of two-point frequency modulation apparatus 10 with improved modulation accuracy, wireless transmitting apparatus 40 is able to transmit high-quality transmission signals.

The present invention is not limited to the above described embodiments, and various variations and modifications may be possible without departing from the scope of the present invention.

This application is based on Japanese Patent Application No. 2004-57523, filed Mar. 2, 2004, entire content of which is expressly incorporated herein by reference.

What is claimed is:

1. A two-point frequency modulation apparatus, comprising:
   a PLL circuit;
   a frequency division ratio setter that sets a frequency division ratio in a frequency divider in the PLL circuit based on a first digital baseband signal and a carrier signal;
   a signal adder that adds a second digital baseband signal to an output signal of a loop filter;

a delay index calculator that calculates a delay index based on a magnitude of change in an amplitude of the signal combining the output signal and the second digital baseband signal; and a delay adjuster that shifts a phase of one of the first digital baseband signal and the second digital baseband signal according to the delay index so as to reduce a phase difference between the first digital baseband signal and the second digital baseband signal.

2. The two-point frequency modulation apparatus of claim 1, wherein the delay index calculator comprises a storage table that stores information representing the delay index.

3. The two-point frequency modulation apparatus according to claim 1, wherein the delay adjuster comprises a digital filter that uses the delay index calculated by the delay index calculator as tap coefficients and shifts a phase of one of the first digital baseband signal and the second digital baseband signal according to the tap coefficients.

4. The two-point frequency modulation apparatus according to claim 1, wherein the delay index calculator and the delay adjuster add the first digital baseband signal and the second digital baseband signal and detect a point where an amplitude value of a result of the addition is maximum so as to adjust a delay difference at a minimum.

5. The two-point frequency modulation apparatus according to claim 1, wherein the delay index calculator and the delay adjuster add the first digital baseband signal and the second digital baseband signal, said second digital baseband signal being an inverted version of the first digital baseband signal, and detect a point where an amplitude value of a result of the addition is maximum so as to adjust a delay difference at a minimum.

6. The two-point frequency modulation apparatus according to claim 1, further comprising an inverter that inverts the second digital baseband signal in relation to the first digital baseband signal.

7. The two-point frequency modulation apparatus according to claim 6, wherein the inverter is provided in one of a signal input port that supplies the first digital baseband signal and the second digital baseband signal and the delay adjuster.

8. The two-point frequency modulation apparatus according to claim 1, wherein the delay adjuster is provided on at least one of a supply route of the first digital baseband signal and a supply route of the second digital baseband signal.

9. A wireless transmitting apparatus comprising the two-point frequency modulation apparatus of claim 1.

10. A wireless communication apparatus comprising the two-point frequency modulation apparatus of claim 1.

* * * * *